(12) United States Patent
Rivetti et al.

(10) Patent No.: US 11,081,614 B2
(45) Date of Patent: Aug. 3, 2021

(54) INTEGRATED SENSOR OF IONIZING RADIATION AND IONIZING PARTICLES

(71) Applicant: LFOUNDRY S.R.L., Avezzano (IT)

(72) Inventors: Angelo Rivetti, Turin (IT); Lucio Pancheri, Trento (IT); Piero Giubilato, Conegliano (IT); Manuel Dionisio Da Rocha Rolo, Turin (IT); Giovanni Margutti, Avezzano (IT); Onorato Di Cola, Barete (IT)

(73) Assignee: LFOUNDRY S.R.L., Avezzano (IT)

( * ) Notice: Subject to any disclaimer, the term of this patent is extended or adjusted under 35 U.S.C. 154(b) by 0 days.

(21) Appl. No.: 16/758,088

(22) PCT Filed: Oct. 22, 2018

(86) PCT No.: PCT/IB2018/058186
§ 371 (c)(1),
(2) Date: Apr. 22, 2020

(87) PCT Pub. No.: WO2019/082045
PCT Pub. Date: May 2, 2019

(65) Prior Publication Data
US 2020/0328321 A1  Oct. 15, 2020

(30) Foreign Application Priority Data
Oct. 27, 2017  (IT) ................. 102017000122669

(51) Int. Cl.
*H01L 31/115* (2006.01)
*H01L 31/117* (2006.01)
(Continued)

(52) U.S. Cl.
CPC ...... *H01L 31/117* (2013.01); *H01L 31/02016* (2013.01); *H01L 31/022408* (2013.01)

(58) Field of Classification Search
CPC ............ H01L 31/117; H01L 31/02016; H01L 31/022408; H01L 2924/13072; H01L 2924/13076
(Continued)

(56) References Cited

U.S. PATENT DOCUMENTS

| 4,885,620 A | 12/1989 | Kemmer et al. |
| 5,465,002 A | 11/1995 | Snoeys et al. |

(Continued)

OTHER PUBLICATIONS

International Search Report and Written Opinion for Corresponding International Application No. PCT/IB2018/058186 (9 Pages) (Feb. 27, 2019).

(Continued)

*Primary Examiner* — Calvin Y Choi
(74) *Attorney, Agent, or Firm* — Lucas & Mercanti, LLP

(57) ABSTRACT

This disclosure provides a semiconductor sensor of ionizing radiation and/or ionizing particles with a backside bias electrode and a backside junction for completely depleting the semiconductor substrate up to carrier collection regions each connected to a respective collection electrode of carriers generated by ionization in the substrate. Differently from prior sensors, the sensor of this disclosure has an intermediate semiconductor layer formed upon the substrate, having a greater doping concentration than the doping concentration of the substrate and a doping of a same type. In this intermediate layer, buried doped regions of opposite type one separated from the other are formed for shielding superficial regions in which readout circuits are defined.

8 Claims, 11 Drawing Sheets
(9 of 11 Drawing Sheet(s) Filed in Color)

(51) Int. Cl.
   *H01L 31/02* (2006.01)
   *H01L 31/0224* (2006.01)
(58) Field of Classification Search
   USPC .......................................................... 257/429
   See application file for complete search history.

(56) References Cited

U.S. PATENT DOCUMENTS

| | | |
|---|---|---|
| 8,901,690 B2 | 12/2014 | Popp et al. |
| 2005/0173733 A1 | 8/2005 | Struder et al. |
| 2013/0037899 A1* | 2/2013 | Popp .................. H01L 27/1463 257/429 |

OTHER PUBLICATIONS

Lutz, "Silicon radiation detectors", Nuclear Instruments & Methods in Physics Research, 1995, vol. A367, No. 1, pp. 21-33.

* cited by examiner

INTEGRATED SENSOR OF IONIZING RADIATION AND IONIZING PARTICLES

CROSS-REFERENCE TO RELATED APPLICATIONS

This application is a 371 of PCT/IB2018/058186, filed Oct. 22, 2018, which claims the benefit of Italian Patent Application No. 102017000122669, filed Oct. 27, 2017.

TECHNICAL FIELD

This disclosure relates to a device for sensing radiation and/or ionizing particles. In particular, this disclosure relates to a completely depleted integrated semiconductor sensor having reverse biased PIN diodes which collect carriers generated by incident beams of radiation or of ionizing particles.

BACKGROUND

Reverse biased PIN diodes may collect carriers generated by an incident beam of radiation or ionizing particles and can be used in the detection of such radiation and particles. With PIN diodes arranged in a one-dimensional or two-dimensional array on a chip, there are different ways of connecting them to readout circuitry for detection. One way is to put the readout circuitry on a separate integrated circuit and then to bump-bond that chip to the sensor chip containing only the PIN diodes. Another is to integrate all, or at least a large part of the readout circuitry with the diodes on the same chip.

Typically, the junction of the PIN diodes is created by diffusion at the front side of its wafer and the readout circuitry is formed in wells, which are of the same conduction type as the substrate and very close to the junction of the diodes. To divert the field lines from the well containing the readout circuits to the carrier collection electrode connected to the PIN diode that collects carriers, a high bias is necessary for the well in order to collect most of the charge generated by the incident radiation. In order to keep this bias within a reasonable limit, the collection electrode is made quite large with respect to the well. This may result in a significant loss of area on the chip and a considerable loss in (spatial) resolution.

Present technologies for detecting ionizing radiation with a spatial resolution are mainly based upon the so called hybrid approach (chip for reading+chip with sensors). A monolithic approach appears more convenient both for costs as well as for performances (low parasitic capacitances and thus smaller electronic noise).

In order to maximize collection of carriers generated by passage of ionizing radiation or particles throughout semiconductor sensors, the sensors are designed so as to have a depletion region that covers either partially or fully the thickness of the sensor from the substrate to a collection electrode. Throughout depletion regions, there is a reduced probability of recombination of carriers generated by the radiation than in non depleted regions, and thus the sensitivity of the sensor is increased.

A partially depleted sensor is depicted in FIG. 1, in which the depletion region around the sensing diode is highlighted. Carriers (electrons, in the depicted example), generated by a ionizing radiation or particle, wander in the epitaxial layer as far as they attain the depletion region, in which they are quickly brought to the collecting diode. Readout circuits are integrated in the same substrate, schematically represented as transistors NMOS and PMOS, formed in doped wells of opposite type in order to prevent recombination of charges to be collected by the collection diode.

Partially depleted sensors have a small parasitic capacitance and thus a smaller electronic noise. Nevertheless, only part of the generated carriers are collected by diffusion, thus the carrier collection is relatively slow and inefficient. Moreover, collection of carriers depends on the position at which the incident ionizing radiation or particle falls in respect to the collection diode.

In order to overcome these limitations, completely depleted sensors have been proposed. A monolithic integrated sensor of this type is schematically depicted in FIG. 2. These sensors comprise other circuits monolithically integrated with a collection diode on a same semiconductor layer, that is completely depleted. The inverse voltage, required for depleting the layer in which the collection diode is integrated, is applied from the front side of the sensor, thus the thickness of the depletion region is limited because it is not possible to apply relatively large inverse voltages without affecting the functioning of the other front-end integrated circuits on the same side of the chip.

A similar approach, using a thick substrate layer having also a relatively great resistivity, is disclosed in U.S. Pat. No. 8,901,690 and is depicted in FIG. 3. It substantially comprises a heavily doped bias layer 104 formed below a lightly doped N-substrate 102. The heavily doped bias layer 104 is defined upon the backside of the substrate 102 so as to form a P-N junction that helps in completely depleting the substrate 102. In the substrate 102 there are P doped regions 103b and 103c coupled with the carrier collection electrode 103, and a doped guard ring 105b for shielding other electronic circuits 106 from carriers generated in the substrate 102 by ionizing radiation and/or particles. By applying a reverse voltage at the front side of the device (108, 109), a depletion zone is formed in the substrate 102. Holes formed by ionizing radiation or particles cross in the depletion zone 110 and are quickly brought to the carrier collection electrode 103.

Another sensor of ionizing radiation or particles is disclosed in the prior document U.S. Pat. No. 5,465,002 and is schematically shown in FIGS. 4A and 4B. When ionizing radiation or particles are incident, most of the charge which is thereby generated is collected by front-side collection electrodes 18. In order to collect the maximum possible amount of generated charge, the device has a backside electrode (the metal layer 22) in contact with the heavily doped bias layer that creates a backside junction. The depletion layer starts from the backside of the substrate and extends up into the bulk as the bias is increased. All the flow lines 30 inside the depletion layer should end at the collection electrode 18, instead of the well 20 containing a readout circuitry. For this purpose, the well 20 is biased so as to repel carriers flowing towards the front side surface, thereby diverting them to the collection electrode 18.

An advantage of having a backside junction consists in that it is possible to have a fully depleted substrate without having to impose too great inverse voltages at the front side, more precisely between the well 20 and the collection electrode 18, thus it is possible to use low voltage electronic circuits. Nevertheless, there is the need of having a relatively large inverse voltage in order to fully deplete the substrate and at the same time the need of preventing current flow by punch-through effect between the backside electrode 22 and the well 20 shielding the front-end electronic circuits. This latter need is contrasting with the former need because an electronic circuitry realized with a deep-submicron technology cannot withstand a relatively great inverse voltage.

This drawback is highlighted by simulations carried out by the applicant for a sensor of the type shown in FIG. 4B with the thickness and dopant concentrations shown in FIG. 5. A silicon wafer having a thickness of 300 µm with a n-type substrate doped with phosphorus at a concentration of $2.5 \cdot 10^{12}$ cm$^{-3}$ has been considered. Simulations of electric potential distribution in this sensor are depicted in FIGS. 6A, 6B and 6C, obtained by keeping at 0V the superficial p-doped regions PWELL in which front-side electronic circuits are formed, by applying a positive voltage to the collection electrode defined upon the n-type collection region NWELL and by sweeping the backside voltage up to −120V. As shown in FIGS. 6A to 6C, the depletion region from the backside attains the front-side surface and merges with the depletion region of the front-side superficial doped regions PWELL and NWELL, causing also a punch-through effect when no positive voltage is applied to the carrier collection region NWELL.

In order to deplete completely the substrate up to the carrier collection region NWELL without causing a punch-through effect, it is necessary to apply a positive voltage at the carrier collection region NWELL. As shown in the graph of FIG. 7, when the voltage at the region NWELL increases (keeping null the voltage at the region PWELL), a complete depletion of the substrate up to the region NWELL is attained for a backside bias voltage (the depletion voltage) of smaller absolute value than the backside voltage (the punch-through voltage) at which the punch-through effect begins. As may be inferred from FIG. 7, the prior sensor of FIG. 5 may be used only if the region NWELL has a bias voltage sufficient to induce a difference of several tens of Volts between the depletion voltage and the punch-through voltage, i.e. when the bias voltage difference between the regions NWELL and PWELL is about 10V. This bias voltage difference is too great in devices that contemplate direct connection of the carrier collection regions NWELL with a low-voltage front-end electronic circuits formed in the p-doped region PWELL.

SUMMARY

It has been found a semiconductor sensor of ionizing radiation and/or ionizing particles with a backside bias electrode and a backside junction for completely depleting the semiconductor substrate up to carrier collection regions each connected to a respective collection electrode of carriers generated by ionization in the substrate.

Differently from prior sensors, the sensor of this disclosure has an intermediate semiconductor layer formed upon the substrate, having a greater doping concentration than the doping concentration of the substrate and a doping of a same type. In this intermediate layer, buried doped regions of opposite type one separated from the other are formed for shielding superficial regions in which readout circuits are defined.

The semiconductor sensor is defined in the annexed claims.

The claims as filed are integral part of this specification and are herein incorporated by reference.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

In prior sensors, there is a small difference between the backside voltage (the depletion voltage) at which the depleted region of the substrate attains the carrier collection regions, and the backside voltage (the punch-through voltage) at which the punch-through effect begins at the doped superficial regions containing the readout electronic circuits or other peripheral electronic circuits. In order to increase this difference, in prior sensors the doped superficial regions containing electronic circuits are biased so as to divert carrier flow towards the carrier collection regions. This cannot be safely done in relatively small sensors in which the carrier collection regions can be directly connected to the readout electronic circuits only if there is a bias voltage of about 1V. Moreover, the resistivity of the substrate is relatively large, thus the potential barrier at the borders of the doped regions in which peripheral electronic circuits are formed is relatively low and carrier may flow therethrough.

Figure 1:
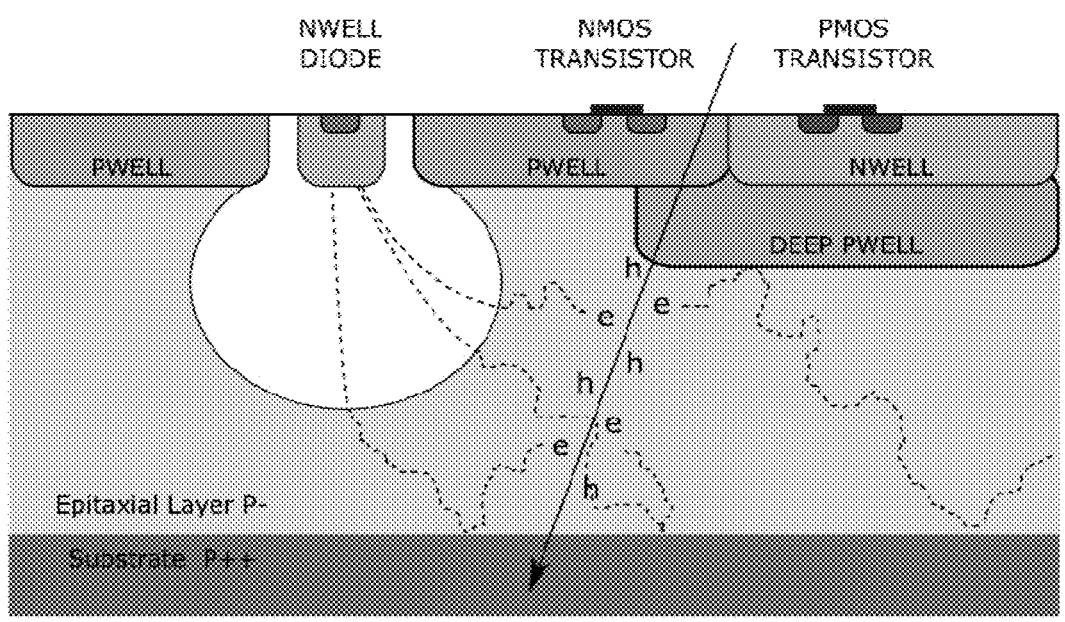
FIG. 1 shows a prior sensor of ionizing radiation or particles with a partially depleted substrate region, represented as a white cavity, around the carrier collection junction.
Figure 2:
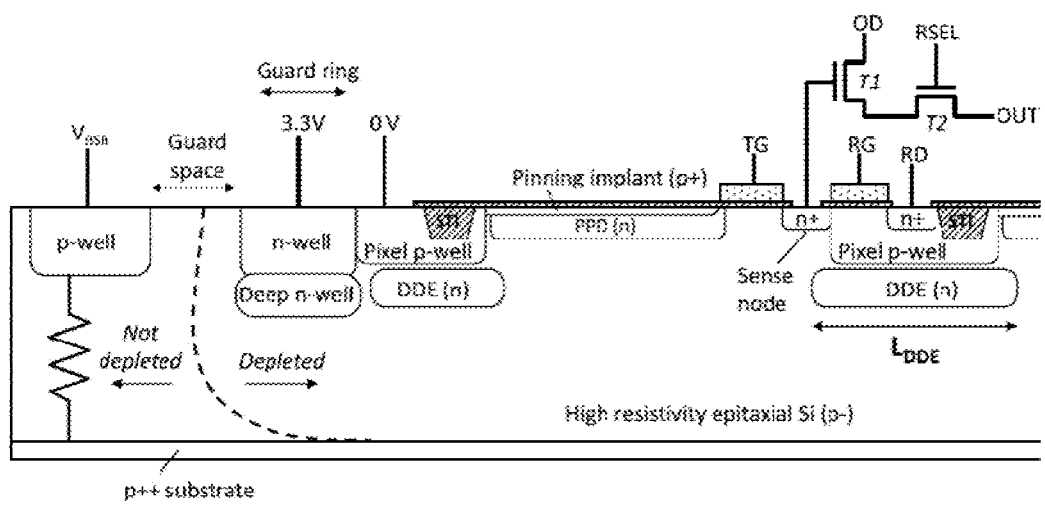
FIG. 2 shows a prior sensor of ionizing radiation or particles with a completely depleted substrate comprising other circuits monolithically integrated with the carrier collection junction.
Figure 3:
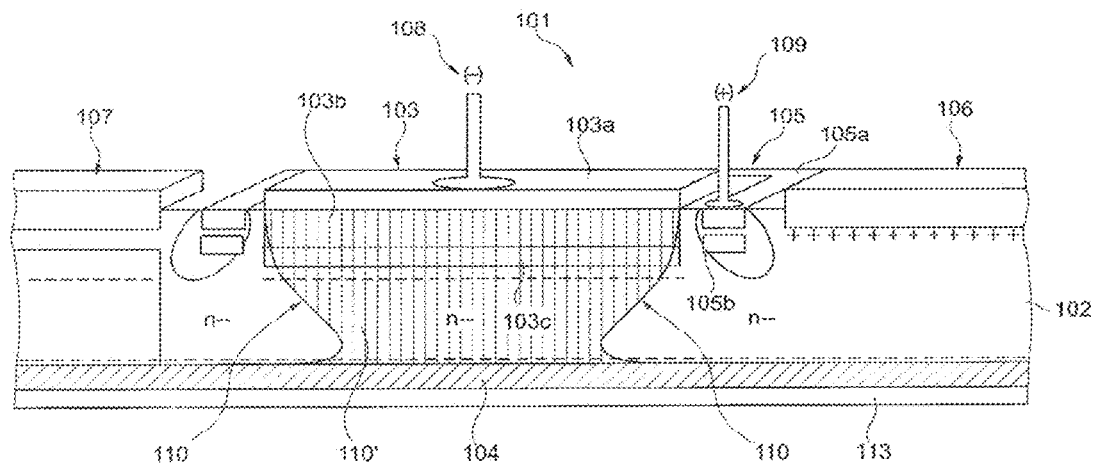
FIG. 3 shows a prior sensor of ionizing radiation or particles with a thick substrate layer having also a great resistivity, completely depleted for better detecting carriers generated by ionization.
Figure 4A:
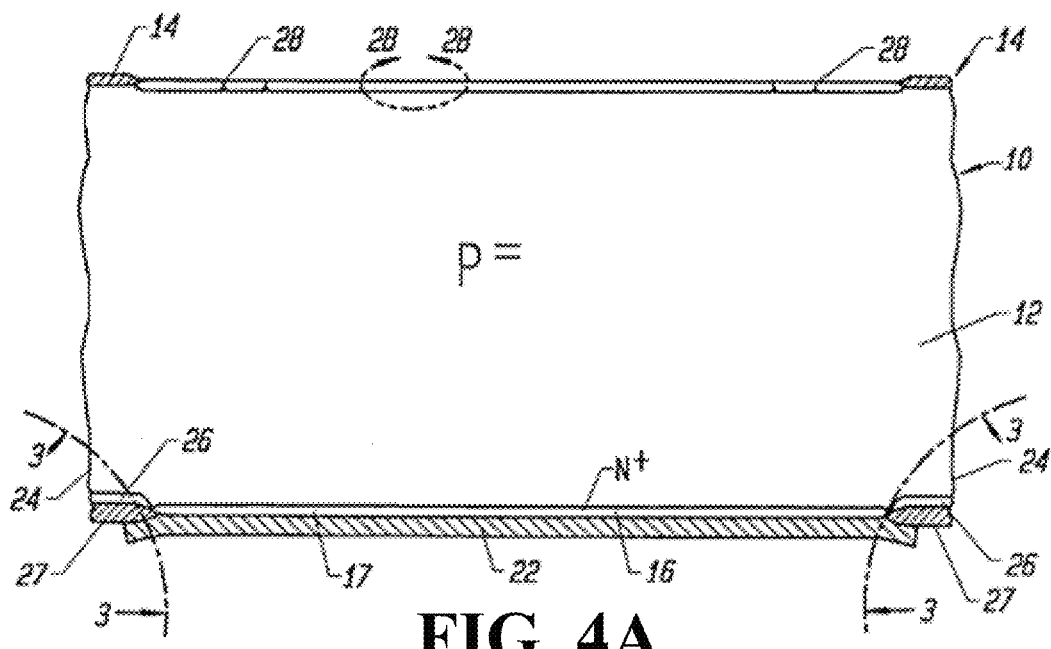
FIG. 4A depicts a prior sensor of ionizing radiation or particles with a backside metal electrode.
Figure 4B:
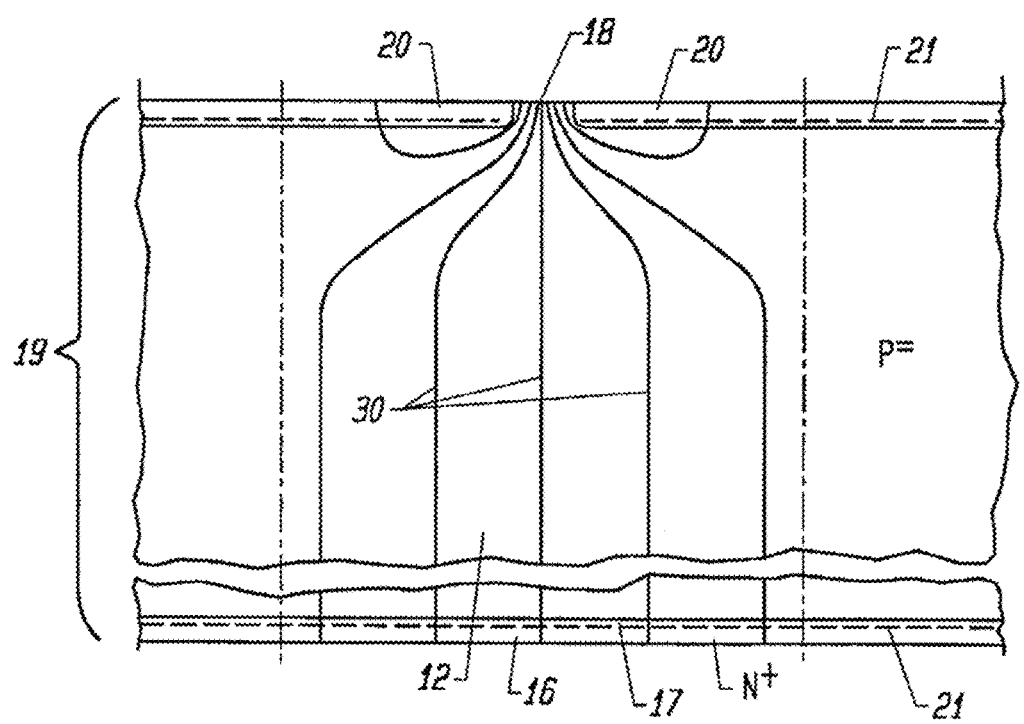
FIG. 4B schematically shows drift paths of carriers in the prior sensor of FIG. 4A.
Figure 5:
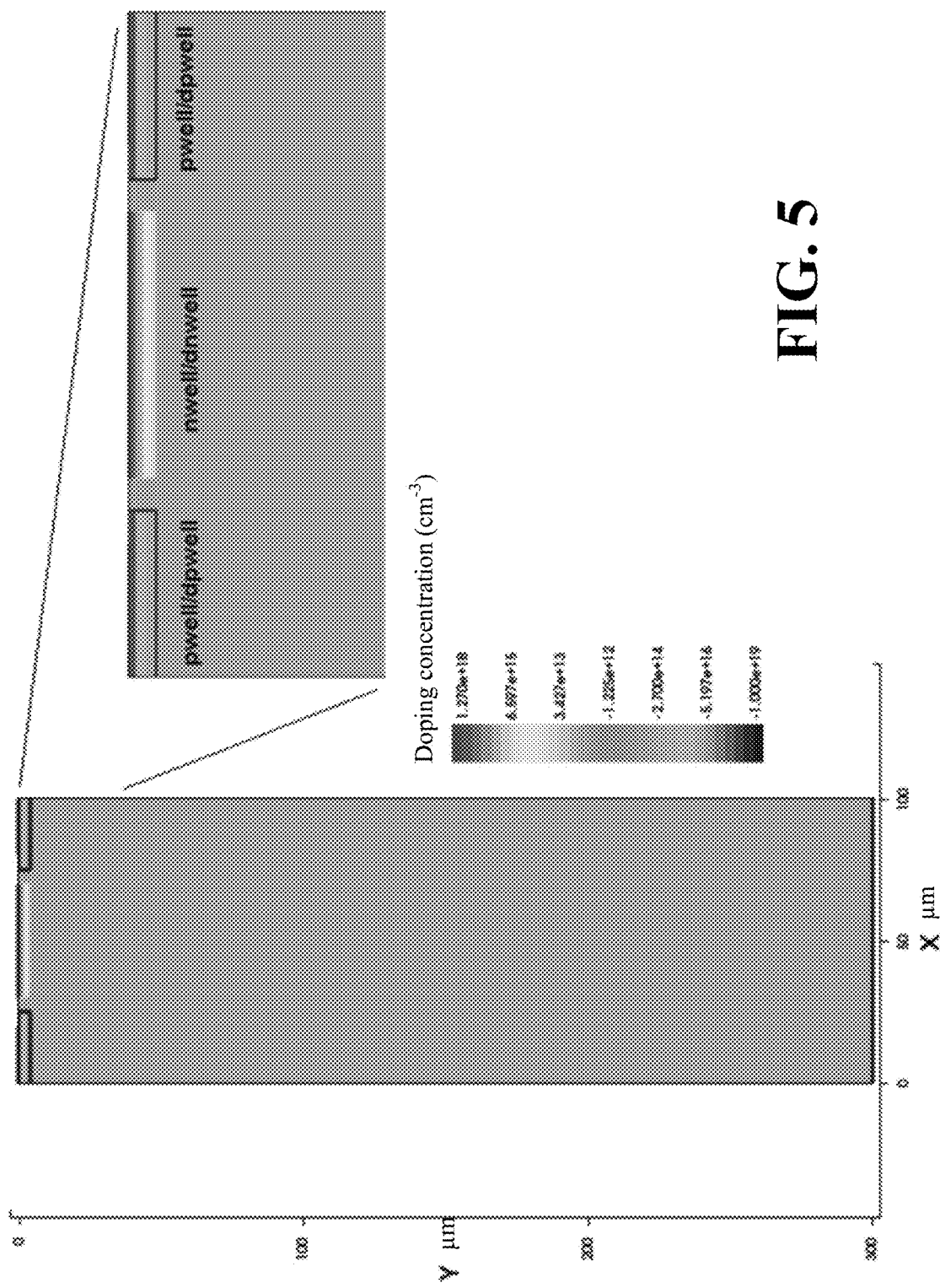
FIG. 5 is an exemplary diagram of thicknesses and doping concentrations of the regions/layers that compose the semiconductor sensor of FIG. 4B.
Figure 6A:
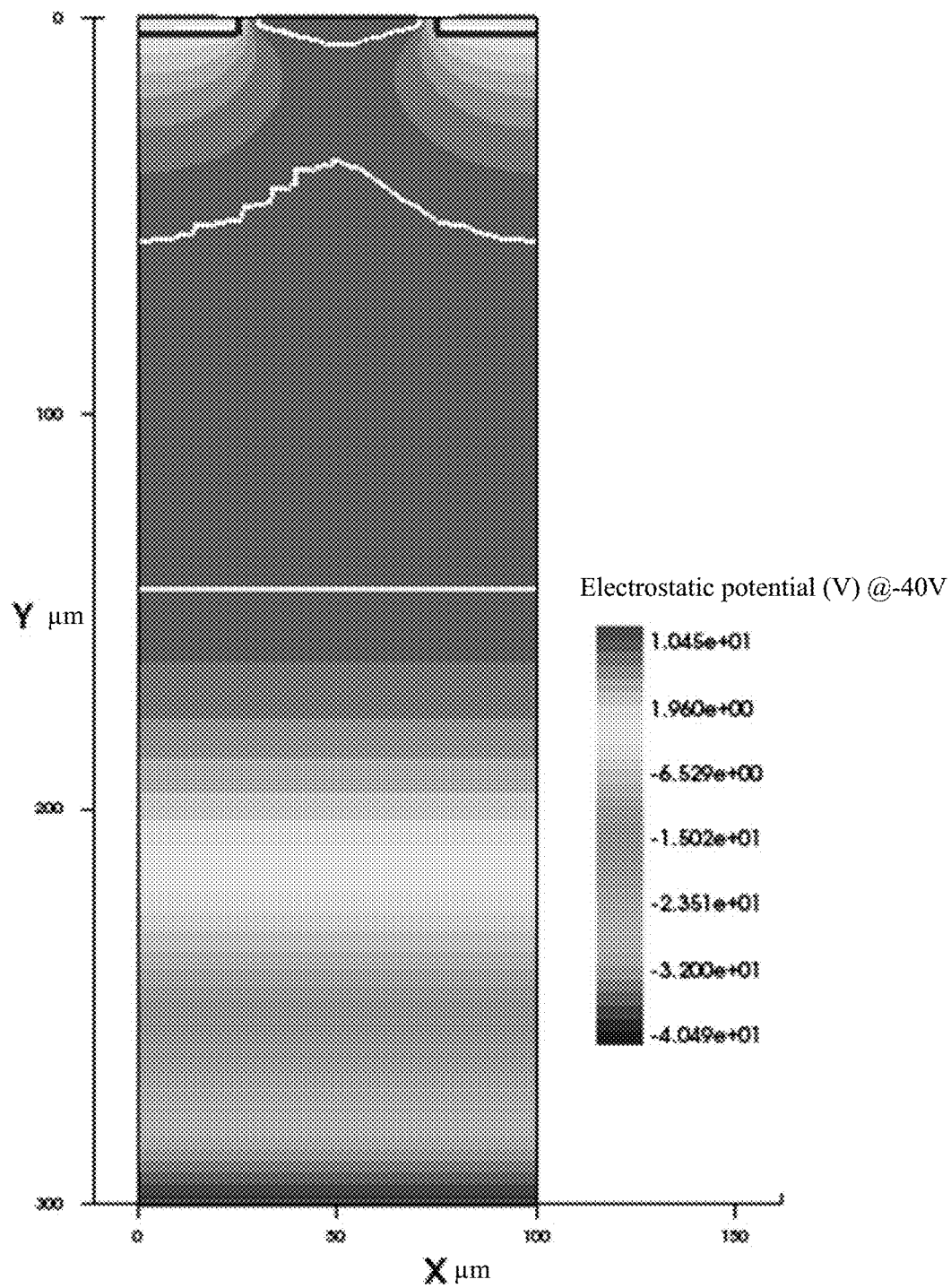
FIGS. 6A to 6C illustrate distributions of the electrostatic potential in the sensor of FIG. 5 when the inverse bias voltage is −40V, −80V and −120V, respectively.
Figure 6B:
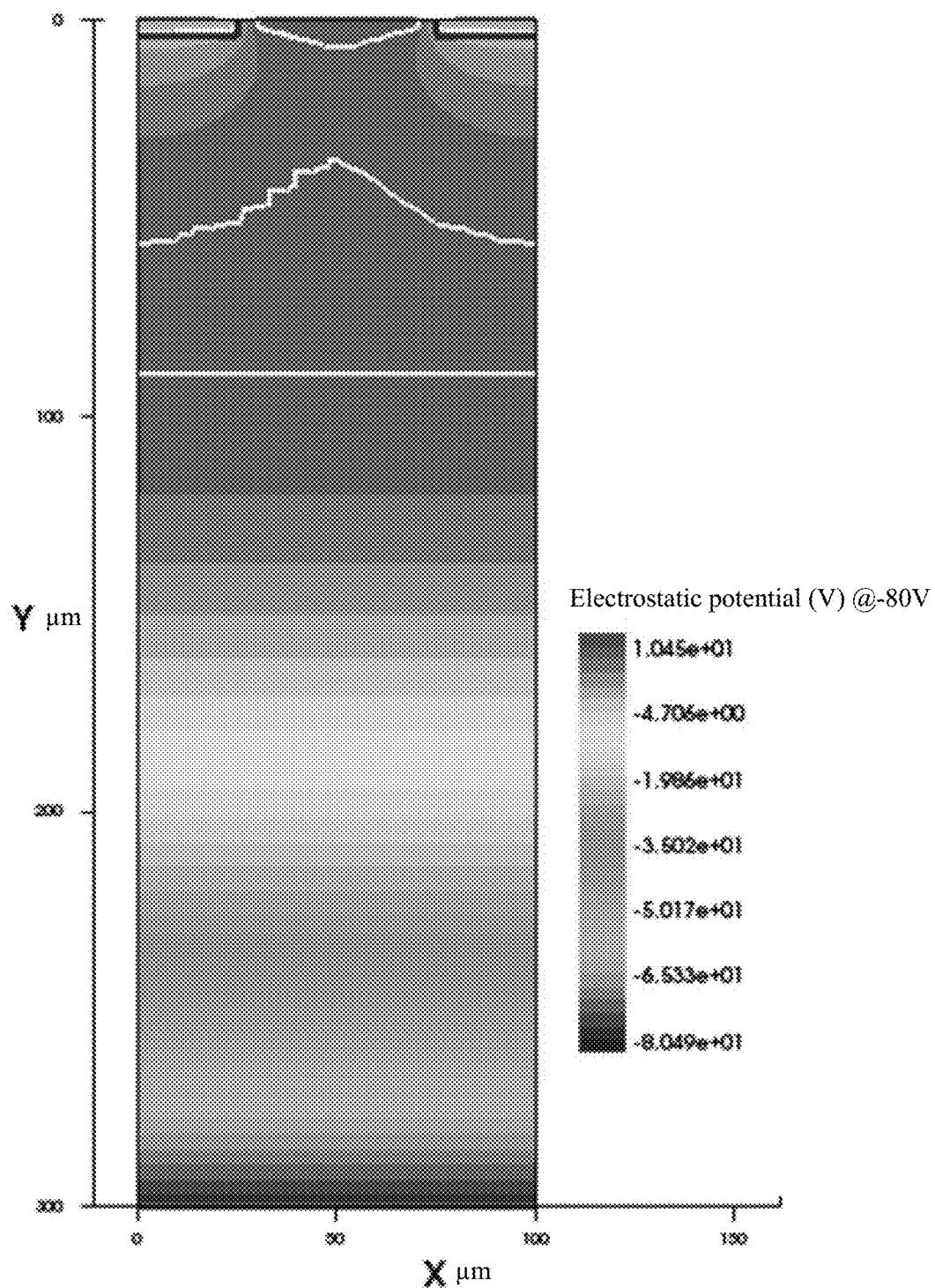
Figure 6C:
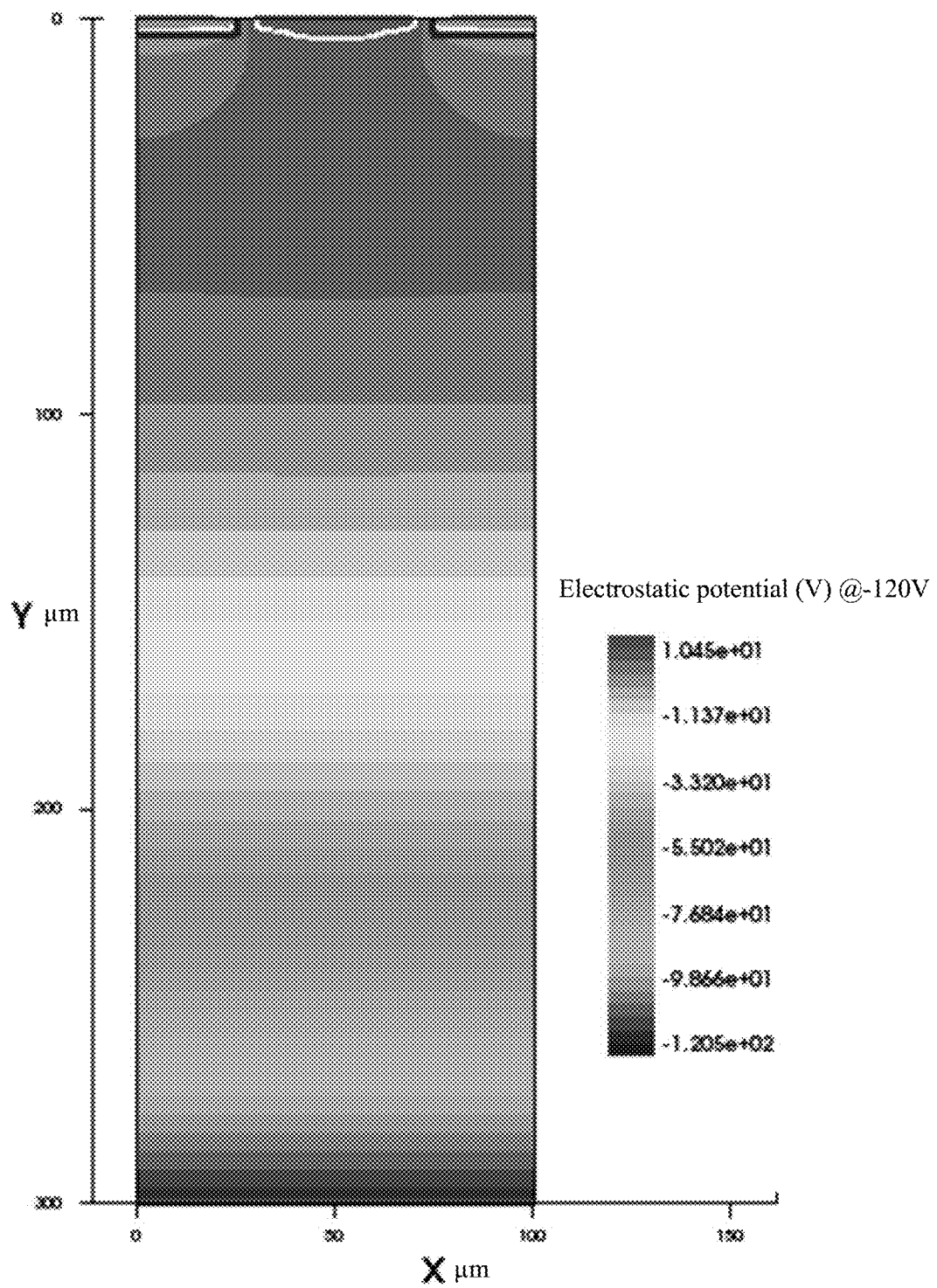
Figure 7:
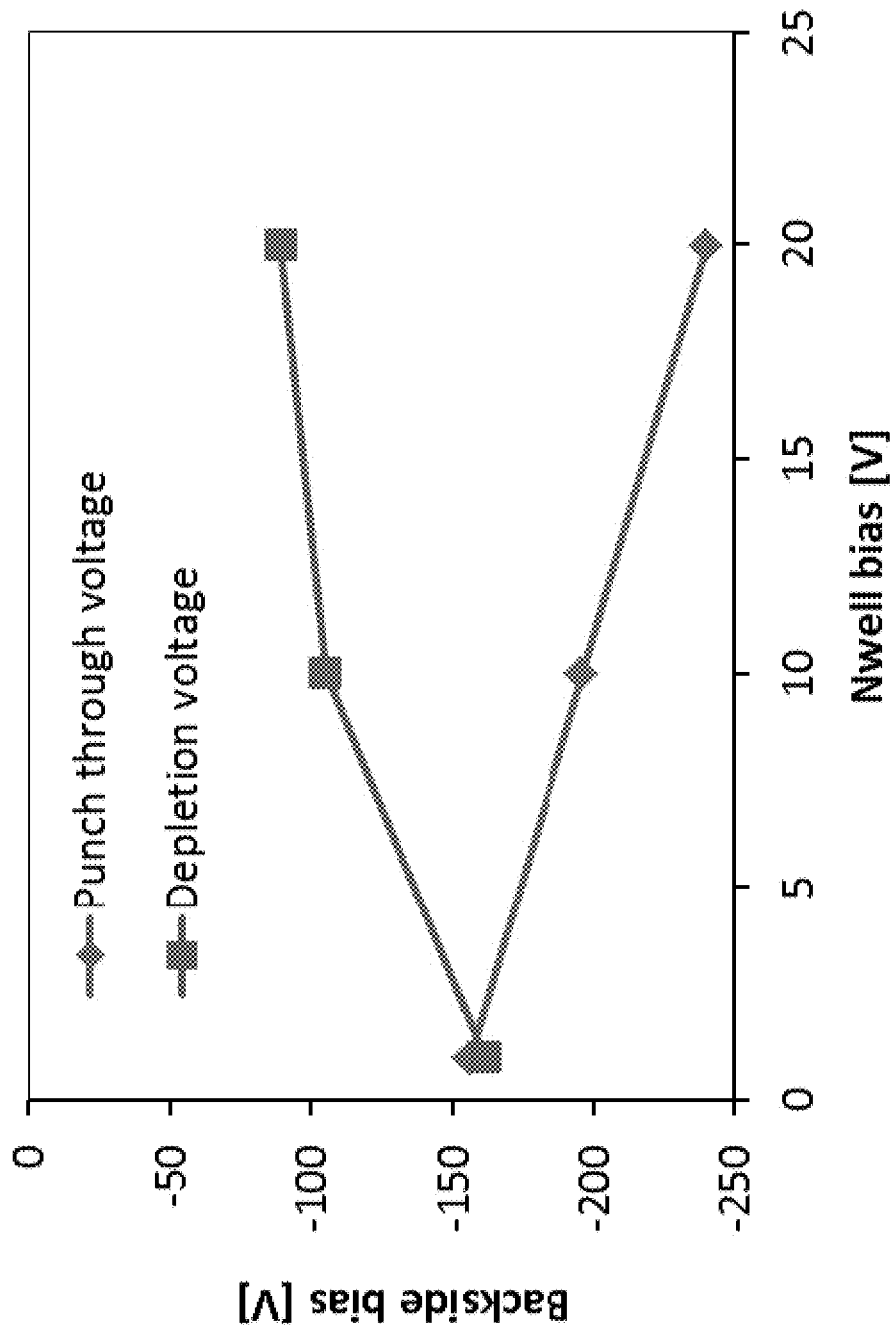
FIG. 7 is a graph of the combination of biasing voltages at which complete depletion of the substrate and of the intermediate layer up to the collection junction, and at which start of punch-through between the substrate and the intermediate layer are attained.
Figures 8A, 8B:
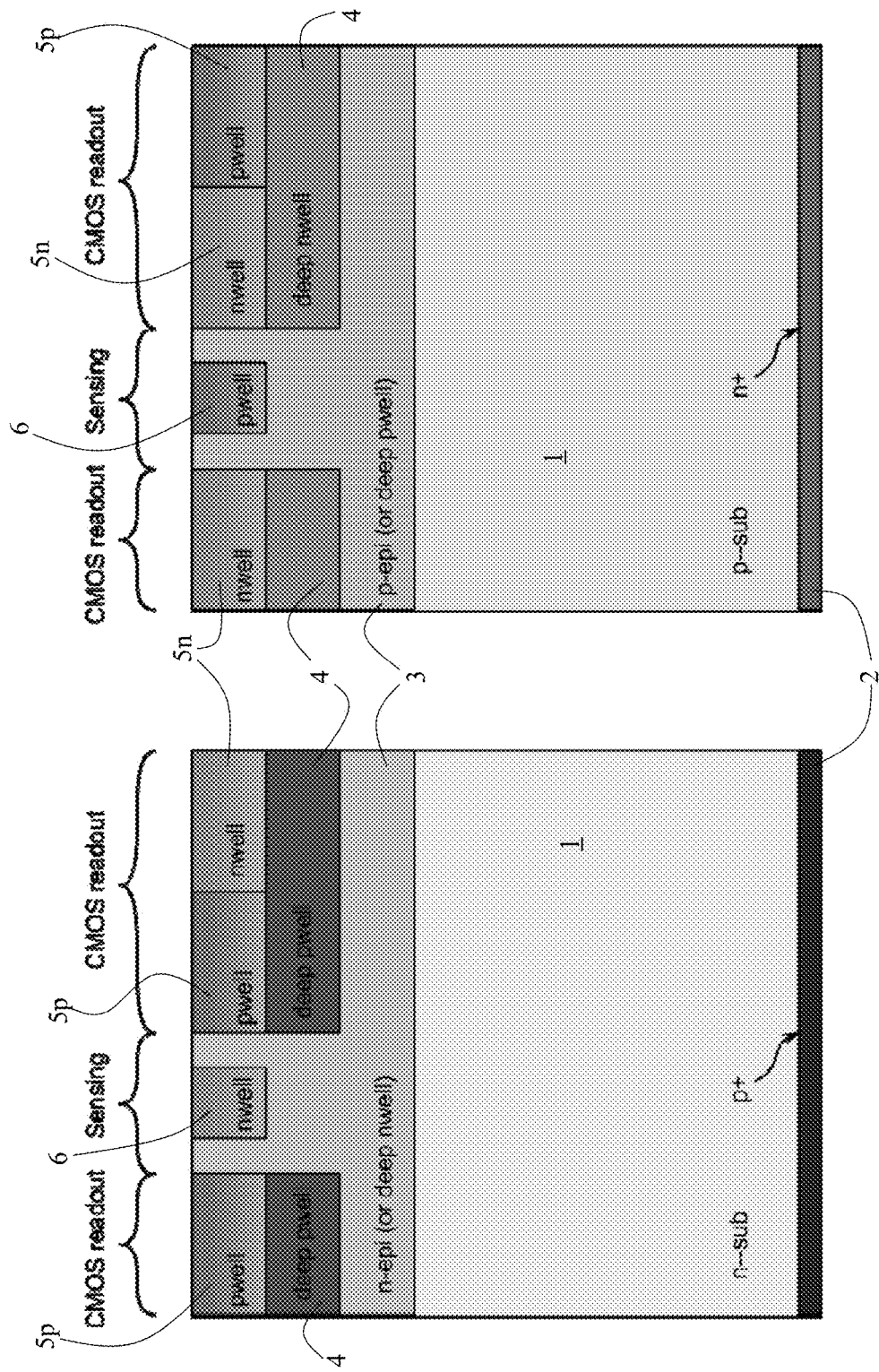
FIGS. 8A and 8B schematically illustrate two semiconductor sensors of ionizing radiation or particles according to this disclosure.

Two semiconductor sensors of ionizing radiation or particles according to this disclosure are depicted in FIGS. 8A and 8B, with a N-type substrate 1 and a P-type substrate 1, respectively. The shown structures are one the dual version of the other, are represented out-of-scale for clarity reasons, and may be replicated as many times as needed on a semiconductor wafer in order to realize a plurality of carrier collection electrodes.

A sensor of this disclosure has a semiconductor substrate 1, typically with a light doping, in which carriers are generated by ionizing radiation or particles that impinge on the substrate 1. Upon a backside of the substrate 1, a highly doped bias semiconductor layer 2 is formed. A backside bias electrode, not shown in FIGS. 8A and 8B, is formed on the surface of the bias layer 2 opposite to the interface with the substrate 1. The bias layer 2 is thinner and more heavily doped than the substrate 1 so as to save space and to deplete the substrate 1 with a relative small reverse bias voltage.

According to an aspect of this disclosure, an intermediate semiconductor doped layer 3 of the same type of the substrate 1 and with a greater doping than the substrate 1 is defined upon a front side of the substrate 1. In this intermediate doped layer 3, the function of which will be clearer in the ensuing description, are defined buried regions 4 of opposite type one isolated from the other, in which superficial doped regions of p-type 5p and of n-type 5n with readout electronic circuits (for example CMOS readout circuits, as schematically indicated in the figures) are defined. In the superficial portions of the intermediate doped layer 3 separating two buried regions 4, doped collection regions 6 are formed so as to be at a distance from the superficial doped regions of p-type 5p and of n-type 5n. The collection regions 6 are connected to respective collection electrodes, not shown in FIGS. 8A and 8B.

By applying an appropriate reverse voltage between the backside bias electrode and the collection electrodes, the bias layer 2 depletes the substrate 1 from the backside and the carrier collection regions 6 deplete the portions of the intermediate layer 3 between the buried regions 4 and the substrate 1 from the front-side, and so a completely depleted region from the substrate 1 to the carrier collection regions 6 is formed.

The device of the present disclosure provides excellent performances even with voltage differences of about 1V between the carrier collection regions 6 and the doped regions 4 and 5p, 5n.

In the preferred embodiment shown in FIGS. 8A and 8B, the carrier collection regions 6 extend in the intermediate layer 3 less in depth than the doped buried regions 4, which attains a greater depth from the front side of the device. The intermediate semiconductor layer 3 is more heavily doped than the substrate 1 and is of opposite doping type than the buried doped regions 4. Given that between the carrier collection regions 6 and the buried doped region 4 there is a relatively small voltage difference, the potential barrier around the doped regions 4 and 5p, 5n at the interface with the intermediate semiconductor layer 3 remains high enough to prevent carriers from flowing therethrough even in a complete depletion condition, i.e. when the semiconductor portions between the carrier collection regions 6 and the bottom of the substrate 1 are completely depleted. With a further increment of the inverse bias voltage between the carrier collection regions 6 and the substrate 1 beyond the value at which the complete depletion condition is attained, a punch-through effect will start but this further voltage increment is relatively large.

As a less preferred alternative embodiment, not shown in the figures, the carrier collection regions 6 may extend in depth in the intermediate layer 3 as the doped buried regions 4. The resulting sensor would still work, though it would have a greater capacitance and thus it would be affected by an augmented electronic noise.

Figure 9:
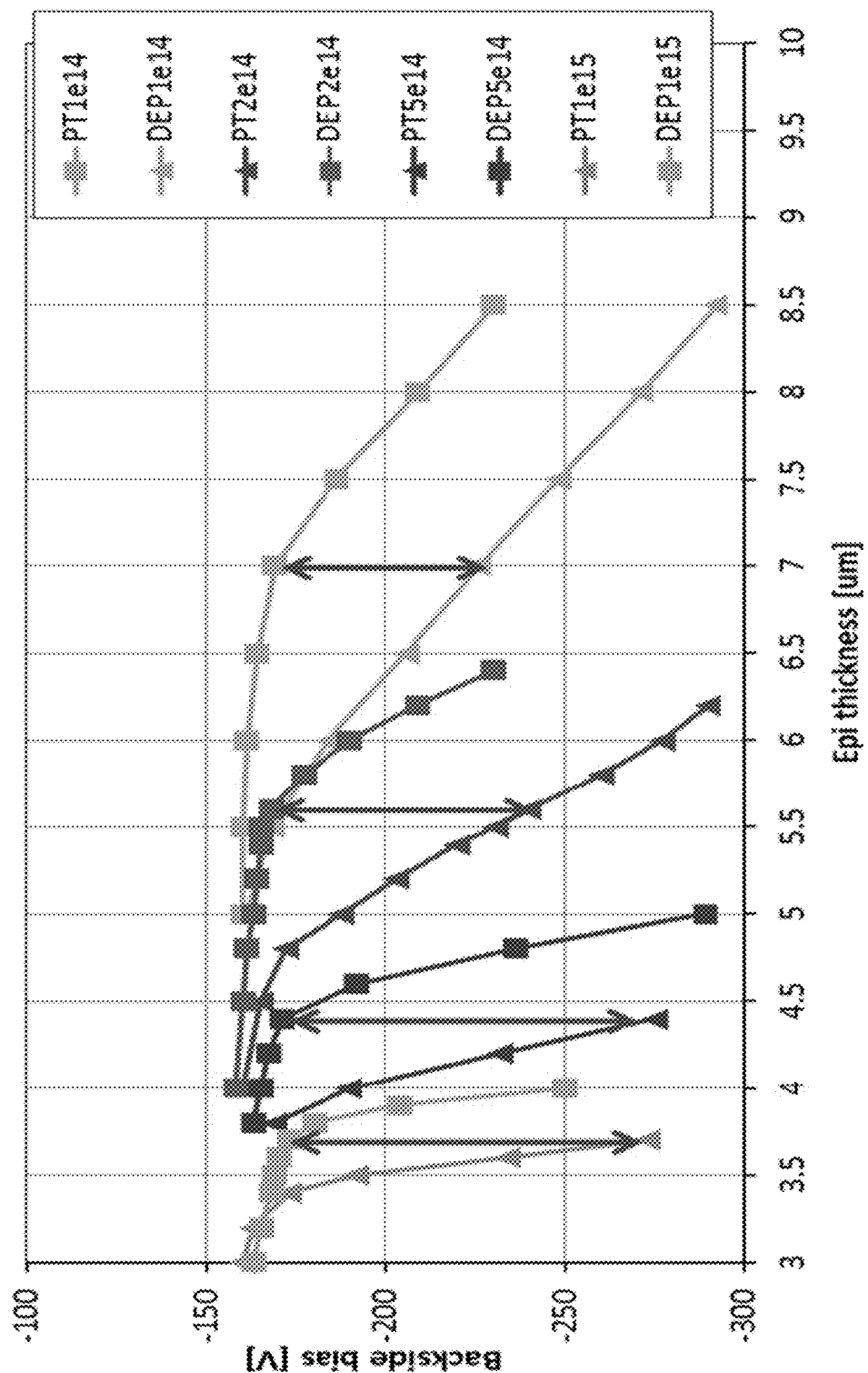
FIG. 9 is a diagram of the punch-through voltage and of the depletion voltage in the sensor of FIG. 8A at different doping concentrations and for different thicknesses of the intermediate layer.

A graph of the backside bias voltage DEP at which the complete depletion condition is attained and the backside bias voltage PT at which the punch-through effect begins for various doping concentrations and the full thickness of the intermediate layer 3 from the substrate 1 up to the free front-side surface, is depicted in FIG. 9. The graph refers to the preferred embodiment in which the intermediate layer 3 is epitaxially grown upon the substrate 2, though a similar graph may be obtained if the intermediate layer 3 is realized by diffusion or implant through the front-side of the substrate 1. The depicted arrows represent the difference between the backside inverse voltage value at which a complete depletion condition is attained and the backside inverse voltage value at which the punch-through effect starts. The larger the doping of the epi layer, the higher the separation between depletion voltage DEP and punch through voltage PT.

During its operation, the sensor may be biased at any voltage between the voltages DEP and PT, i.e. in the regions marked by the arrows. If this operation voltage interval is sufficiently large, local variations of substrate doping and thickness can be tolerated. If, for example, the complete depletion of the substrate up to the epitaxial layer edge varies by 20V due to doping non-uniformities, but the allowed operation region interval is 40V, a bias voltage suitable for the whole device can still be found.

Figure 10:
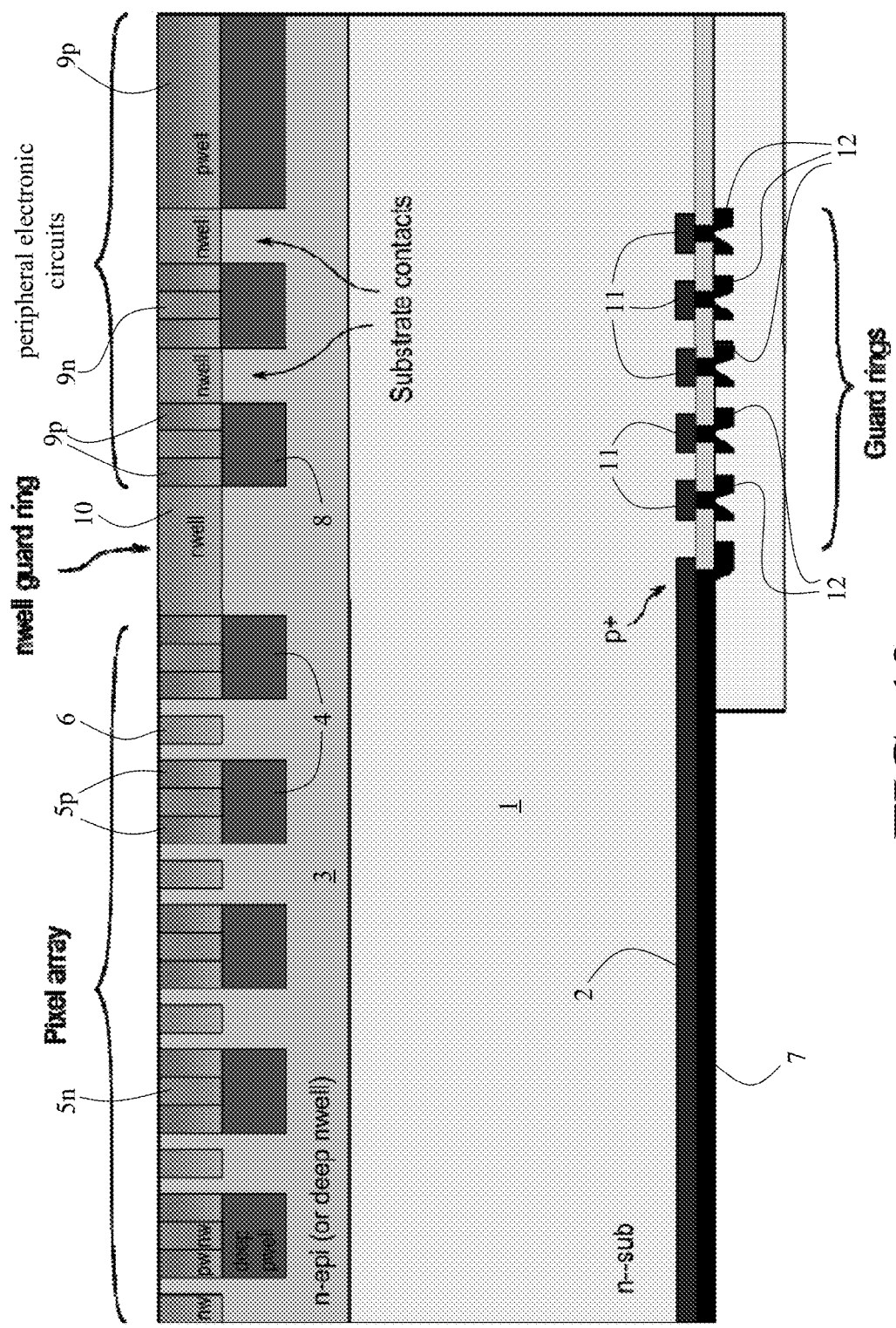
FIG. 10 schematically illustrates a semiconductor sensor of FIG. 8A in which readout electronic circuits are organized in rows and columns of an array of singularly readable pixels, integrated on a same substrate with peripheral electronic circuits.

If the full thickness of the intermediate layer 3 is greater than 7 µm, it is sufficient to have a dopant concentration of $10^{14}$ cm$^{-3}$ in the intermediate layer 3 for making the punch-through effect start only if the inverse backside voltage of the bias layer 2 surpasses by more than 50V the value at which the complete depletion condition is attained. Therefore, with a relatively thin intermediate layer 3 doped with a dopant concentration of reasonable value, it is possible to bias the disclosed sensor for any functioning condition of interest. FIG. 10 depicts a sensor of this disclosure, corresponding to the embodiment of FIG. 8A, wherein the readout electronic circuits formed in the doped superficial regions 5p, 5n are organized in rows and columns of an array of singularly readable pixels. Peripheral electronic circuits are integrated on the same wafer and are formed in corresponding doped superficial regions of p-type 9p and of n-type 9n formed upon buried doped regions 8 defined in depth in the intermediate semiconductor layer 3. The backside metal electrode 7 is projectively below the array of pixels so as not to interfere with the peripheral electronic circuits in the regions 9p, 9n. In order to shield the peripheral electronic circuits from flow of carriers destined to the collection regions 6, there are at least a front-side guard ring 10, constituted by a superficial diffusion 10 in the intermediate layer 3 and of the same doping type of the collection regions 6, and/or backside guard rings comprising backside doped superficial regions 11 and corresponding guard electrodes 12.

The backside layer/regions and electrodes may be realized with a backside processing after having completed the front side electronics, limiting as much as possible the applicable temperature. The implanted dopants may be activated with a rapid thermal annealing process carried out by lasers.

Exemplary values of thickness and of dopant concentration of the sensor depicted in FIG. 8A are summarized in the following table:

| Region | Thickness (range) | Dopant concentration (range) |
|---|---|---|
| 1 | 50 µm-500 µm | $-10^{11}$-$10^{13}$ |
| 2 | 50 nm-500 nm | $+5 \cdot 10^{17}$-$10^{20}$ |
| 3 | 3 µm-10 µm | $-5 \cdot 10^{13}$-$10^{16}$ |
| 4 | 2 µm-5 µm | $+2 \cdot 10^{16}$-$10^{17}$ |

| Region | Thickness (range) | Dopant concentration (range) |
| --- | --- | --- |
| 5p | 0.8 μm–2 μm | $+10^{17}$–$2 \cdot 10^{18}$ |
| 5n | 0.8 μm–2 μm | $-10^{17}$–$2 \cdot 10^{18}$ |
| 6 | 0.5 μm–5 μm | $-10^{16}$–$2 \cdot 10^{18}$ |

The disclosed sensor may be fabricated with a process comprising steps to be carried out on both faces of the semiconductor wafer. It is possible to optimize characteristics of the backside of the sensor for optical, UV and X-ray sensing applications. Moreover, it is possible to realize filters, for example by adding layers in the front side portion of the sensor, or in the back side portion of the sensor, or in both the front side and back side portions of the sensor, in order to enhance transmission efficiency in spectral regions of interest.

The invention claimed is:

1. A semiconductor sensor of ionizing radiation and/or particles, comprising:
a substrate of a semiconductor material having a first doping;
a bias layer formed upon a backside of said substrate, having a second doping of a type opposite to a type of said first doping;
a backside bias electrode, formed on a free surface of said bias layer opposite to a surface of said bias layer in contact with said substrate;
an intermediate layer formed upon a front side of said substrate, having a third doping greater than said first doping and of the same type thereof;
first doped buried regions formed in depth in said intermediate layer, separated one from the other by spacing portions of said intermediate layer, said doped buried regions having a fourth doping of a type opposite to the type of said first doping;
carrier collection regions formed in a front side of said spacing portions of the intermediate layer, fully surrounded therefrom and at a distance from said doped buried regions, said collection regions having a fifth doping greater than said third doping and of a same type thereof, and being extended in depth in said intermediate layer not more than said doped buried regions;
collection electrodes, each formed upon a front side of a respective region of said carrier collection regions;
first doped superficial regions formed upon said first doped buried regions up to a front-side of said intermediate layer; and
readout electronic circuits defined in a front side of said first doped superficial regions, having electric terminals functionally connected with said collection electrodes to detect carriers, generated by ionizing radiation and/or particles into said substrate, collected by said collection regions.

2. The semiconductor sensor according to claim 1, wherein said carrier collection regions are less extended in depth in the intermediate layer than said doped buried regions.

3. The semiconductor sensor according to claim 2, wherein:
said intermediate layer extends upon said substrate up to said first doped buried regions for a thickness of between 1 μm and 6 μm, and extends upon said substrate up to said carrier collection regions for a thickness of between 1 μm and 8 μm;
said substrate has a thickness of between 50 μm and 500 μm;
said first doping is between $10^{11}$ and $10^{13}$ and said third doping is between $5 \cdot 10^{13}$ and $10^{16}$.

4. The semiconductor sensor according to claim 1, wherein said readout electronic circuits are organized in rows and columns of an array of singularly readable pixels.

5. The semiconductor sensor according to claim 4, further comprising:
a front-side doped guard ring formed in a front-side of the intermediate layer so as to encircle all said array of singularly readable pixels;
second doped buried regions formed in depth in said intermediate layer outside of said doped guard ring;
second doped superficial regions formed upon said second doped buried regions up to a front-side of said intermediate layer; and
peripheral electronic circuits defined in a front-side of said second doped superficial regions, functionally connected with electrical terminals of said array of singularly readable pixels.

6. The semiconductor sensor according to claim 5, further comprising:
a backside doped guard ring formed in a backside of the substrate so as to projectively encircle all said array of singularly readable pixels.

7. The semiconductor sensor according to claim 1, wherein said bias layer extends below said substrate for a thickness of between 50 μm and 500 μm, and second doping is between $5 \cdot 10^{17}$ and $10^{20}$.

8. The semiconductor sensor according to claim 1, wherein said intermediate layer is either a doped epitaxial layer grown on said substrate or a doped well defined upon said substrate.

* * * * *